United States Patent [19]
Liddell et al.

[11] Patent Number: 5,488,294
[45] Date of Patent: Jan. 30, 1996

[54] MAGNETIC SENSOR WITH MEANS FOR RETAINING A MAGNET AT A PRECISE CALIBRATED POSITION

[75] Inventors: Peter A. Liddell; Douglas L. Mueller, both of Freeport; Gary L. Wohlers, Cedarville, all of Ill.

[73] Assignee: Honeywell Inc., Minneapolis, Minn.

[21] Appl. No.: 374,020

[22] Filed: Jan. 18, 1995

[51] Int. Cl.⁶ .............................. G01B 7/14; G01R 35/00
[52] U.S. Cl. ................. 324/207.21; 324/202; 324/207.2
[58] Field of Search .......................... 324/207.2, 207.21, 324/252, 202, 260, 251; 338/32 R, 32 H

[56] References Cited

U.S. PATENT DOCUMENTS

| | | | |
|---|---|---|---|
| 4,079,360 | 3/1978 | Ookubo et al. | 324/252 |
| 4,535,289 | 8/1985 | Abe et al. | 324/207.14 |
| 4,725,776 | 2/1988 | Onodera et al. | 324/207.21 |
| 4,853,632 | 8/1989 | Nagano et al. | 324/207.21 |
| 5,041,784 | 8/1991 | Griebeler | 324/207.21 |
| 5,128,613 | 7/1992 | Takahashi | 324/235 |
| 5,289,122 | 2/1994 | Shigeno | 324/252 |
| 5,304,926 | 4/1994 | Wu | 324/207.2 |
| 5,351,028 | 9/1994 | Krahn | 338/32 R |
| 5,359,387 | 10/1994 | Watanabe et al. | 324/207.21 |

FOREIGN PATENT DOCUMENTS

4141958  6/1993  Germany.

OTHER PUBLICATIONS

Article titled "Magnetoresistive Sensors" by B. Pant in fall 1987 Scientific Honeyweller.

Article titled The Permalloy Magnetoresistive "Sensors—properties and applications" by W. Kwiatkowski and S. Tumanski.

*Primary Examiner*—Sandra L. O'Shea
*Assistant Examiner*—Jay M. Patidar
*Attorney, Agent, or Firm*—William D. Lanyi

[57] ABSTRACT

A magnetic sensor is provided with a carrier that has a cavity shaped to receive a magnet in sliding association therein. Ribs are provided to guide the movement of the magnet into the cavity and a deformable rib is used to hold the magnet at a precise position determined by an active calibration process. A magnetically sensitive component is rigidly attached to a substrate and the substrate is rigidly attached to the carrier in which the cavity is formed. Electrically conductive leads are molded into the carrier and extend through the carrier to positions where they can be electrically connected to circuit runs on the substrate. A flexible wall can also be formed in the carrier to deflect in response to the insertion of a magnet into the cavity. This provides additional holding capability that retains the magnet in position when an external force is removed.

20 Claims, 15 Drawing Sheets

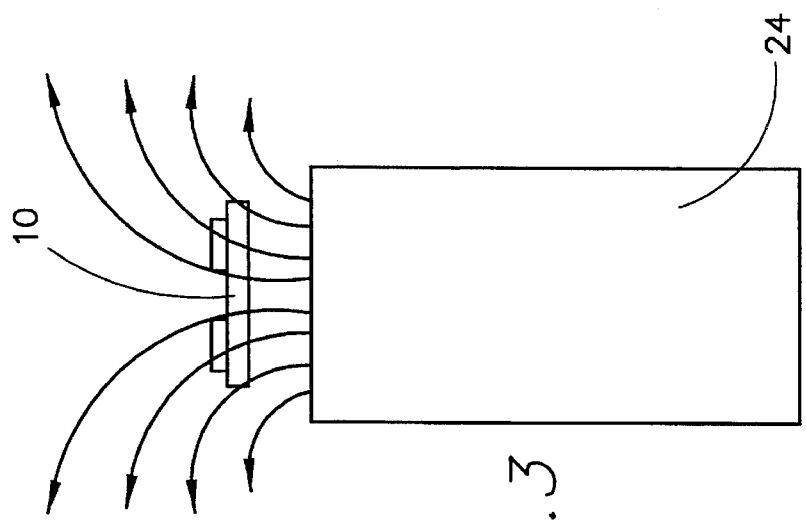
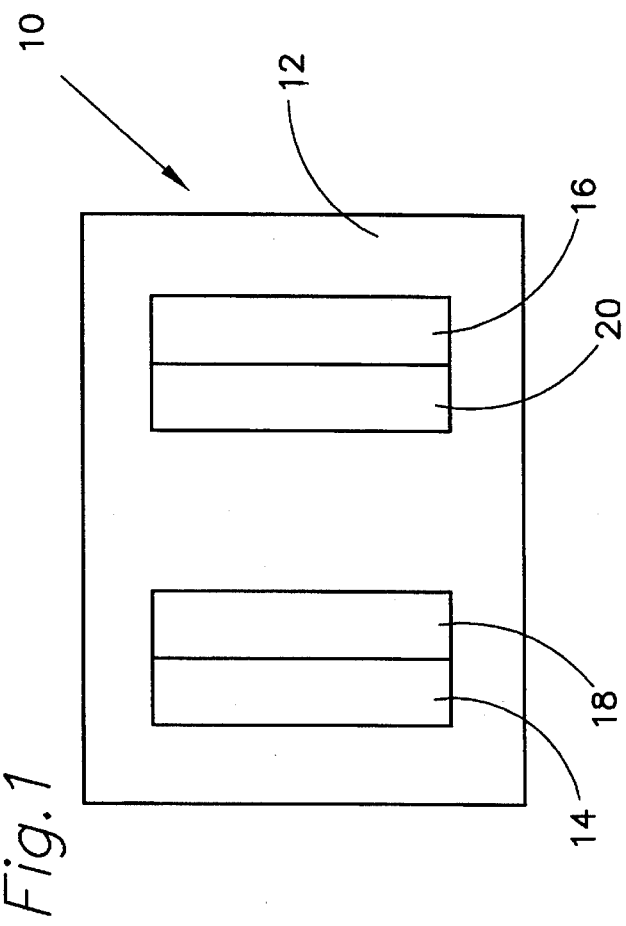
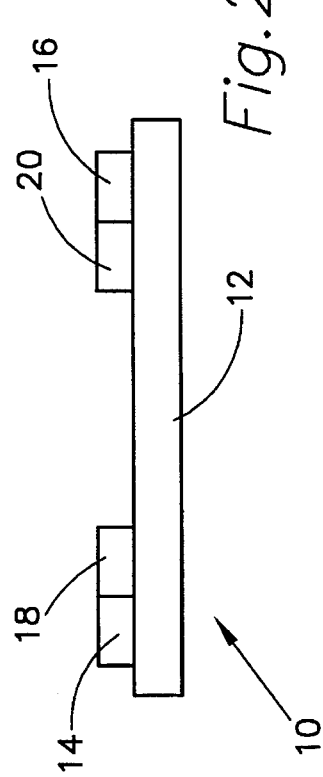

MAGNETIC SENSOR WITH MEANS FOR RETAINING A MAGNET AT A PRECISE CALIBRATED POSITION

BACKGROUND OF THE INVENTION

1. Field of the Invention

The present invention is generally related to magnetic sensors and, more particularly, to a magnetic sensor that can be accurately calibrated by selectively moving a magnet relative to a magnetically sensitive component and rigidly attaching the magnet in position when a desired relationship between the magnet and magnetically sensitive component is achieved.

2. Description of the Prior Art

Many different types of magnetic sensors are known to those skilled in the art. One particular type of sensor incorporates a biasing magnet that is associated with a magnetically sensitive component, such as a magnetoresistive element or a Hall effect element. Sensors which use biasing magnets respond to a change in the magnetic field provided by a permanent magnet when a ferromagnetic object moves into a detection zone. When sensors of this type are intended to be mass produced, the relative position between the magnet and the magnetically sensitive component should be accurately controlled so that ferromagnetic objects can be detected in an identical manner, regardless of the particular sensor used.

Sensors of this type can use either magnetoresistive elements or Hall effect elements. Magnetoresistive sensors are described in an article titled "magnetoresistive Sensors" by B. Pant in the Fall 1987 issue of the Scientific Honeyweller. The article describes the use of magnetoresistive material in various sensor applications. It also discusses the resistance of the sensors and the change in resistance in response to an external magnetic field. Various design tradeoffs are dictated by the forces that compete to determine the direction of magnetization in a thin magnetoresistive film and these tradeoffs are discussed.

U.S. Pat. No. 5,041,784, which issued to Griebeler on Aug. 20, 1991, discloses a magnetic sensor with a rectangular field distorting flux bar. The sensor is used in measuring the position, velocity or direction of movement of an object having alternating zones of magnetic conductivity with a permanent magnet member having a pole face that faces the moving object and having an axis that is transverse to the direction of movement of the object. A ferromagnetic strip of high permeability is mounted on the face of the magnet coaxial with the magnet and having a length dimension in the direction of movement of the object which is greater than the width dimension transversed to the direction of movement.

U.S. Pat. No. 4,725,776, which issued to Onodera et al on Feb. 16, 1988, describes a magnetic position detector that uses a thin film magnetoresistor element that is inclined relative to a moving object. The detector employs magnetoresistive elements and detects magnetic teeth of an object to be detected. More specifically, a constant DC magnetic field is supplied to the magnetoresistive elements in such a way so as to avoid a nonlinear region of the DC magnetic field to permit the use of such elements in the regions exhibiting good linearity. The invention provides the DC magnetic field to the magnetoresistive elements by employing a simple structure wherein the magnetoresistive elements are arranged inclined relative to the magnetic field defined between a permanent magnet and the magnetic teeth.

U.S. Pat. No. 5,289,122, which issued to Shigeno on Feb. 22, 1994, discloses a magnetic sensor for detecting course and fine magnetic patterns, A plurality of sensing parts are deposited and formed on an element substrate in film form. The inside two of the sensing parts are connected in series to be used for a reading of a narrow pitch magnetic pattern and the outside two of the sensing parts are also connected in series to be used for reading a wide pitch magnetic pattern. The connection of the sensing part is carried out by using terminals and wires. The terminals are provided so as to short circuit the ends of the sensing parts.

A review article titled "The Permalloy Magnetoresistive Sensors-Properties and Applications" by W. Kwiatkowski and S. Tumanski, in the 1986 issue of The Institute of Physics, presents a review of the properties and applications of the permalloy magnetoresistive sensors of magnetic fields. It gives information on the manufacturing and biasing methods used in conjunction with the sensors. The basic parameters, which include sensitivity, dimensions, linearity, resolution and transducer errors are analyzed and various methods of improving these parameters are discussed. The examples of permalloy microsensors, miniature sensors and large area sensors are also presented in the paper. The application of permalloy magnetoresistors to measuring magnetic fields and constructing electrical and nonelectrical transducers is described.

U.S. Pat. No. 5,128,613, which issued to Takahashi on Jul. 7, 1992, describes a method for inspecting magnetic carbonization in a nonpermeabile material. A probe is described which comprises a magnet and a Hall element which are provided in a magnetically impermeable case. The Hall element is disposed at the midportion between the two poles of the magnet in parallel with the lines of magnetic flux. The presence of a carbonized portion in the member to be inspected and the depth of the carbonization are detected by passing DC current across the Hall element and detecting the Hall effect electromagnetic force produced between the two ends of the element which are opposed in a direction perpendicular to the flow of the current.

U.S. Pat. No. 4,853,632, which issued to Nagano et al on Aug. 1, 1989, describes an apparatus for magnetically detecting a position of a moveable magnetic body. The apparatus includes a three terminal magnetic field intensity sensing structure formed by a pair of magnetoresistors. The magnetic field intensity sensing structure is disposed opposite to a magnetic body that is arranged for movement relative thereto in a magnetic field and generates a first electrical signal of sinusoidal waveform in response to a change in the intensity of the magnetic field due to the relative movement of the magnetic body. This first electrical signal appears from the apparatus as a second electrical signal of rectangular waveform or of sinusoidal waveform having an amplified amplitude. Components of the circuit for shaping the waveform or amplifying the amplitude of the first electrical signal are integrally mounted together with the magnetoresistors on a substrate. Preferably, the shaping or amplifying circuit is in the form of a hybrid integrated circuit formed on the substrate.

U.S. Pat. No. 4,535,289, which issued to Abe et al on Aug. 13, 1985, discloses a device for measuring a position of a moving object. A detected member made of magnetic material is secured to the moving body and E-shaped magnetic is arranged adjacent the measured member transversed to the direction of motion. A Hall IC for converting the variation of magnetic flux density of the magnet to the variation of voltage is secured to an end of a central leg portion of the magnet. The measured member is an elongated bar and is provided with a series of projections on the elongated bar at both sides. The projections of both sides are arranged in staggered relation. The Hall IC is adjacent to an inner portion of one of the projections when the moving body travels in the elongated directions. The Hall IC produces an output having a waveform with a zero level interval between inverted waves.

U.S. Pat. No. 5,304,926, which issued to Wu on Apr. 19, 1994, describes a geartooth position sensor with two Hall effect elements. The position sensor has two magnetically sensitive devices associated with a magnet. The sensor is disposable proximate a rotatable member having at least one discontinuity in its surface. The two magnetically sensitive devices, such as Hall effect transducers, each provide output signals that represent the direction and magnitude of the magnetic field in which its respective transducer is disposed. An algebraic sum of the first and second output signals from the magnetically sensitive devices is produced as an indication of the location of the rotatable member that is disposed proximate the sensor.

High resolution magnetic gear tooth sensors typically require calibration for specific applications. One such type of application is a complementary target scheme such as that disclosed in U.S. patent application Ser. No. 08/032,883 which was filed by Wu on Mar. 18, 1993 and assigned to the Assignee of the present application.

This type of gear tooth sensor can use a magnetic system which requires the adjustment of the magnet in order to achieve magnetic null for proper system operation. Zero crossing detection is used in the conditioning circuitry to achieve the highest possible accuracy. Previously, prototype devices of this type have been calibrated around the zero crossing by simply adjusting the biasing magnet behind a magnetoresistive sensor until the bridge output is equal to its original bridge null prior to the introduction of the bias. This analog output of the bridge had been constantly monitored during a first portion of calibration procedure which was completed once the original null voltage had been reached. Adjustment was made without the presence of a complementary target placed within the detection zone of the magnetic sensor. The last portion of the calibration procedure was achieved by adjusting the circuit null to coincide with the originally measured bridge null. Although this type of calibration scheme has been generally successful for providing prototype sensors when the sensors had separate bridge and circuitry components, it also provides several serious disadvantageous limitations when flexibility, manufactureability and produceability are considered. For example, a two-step calibration procedure was required and this is not cost effective. A scheme of this type not only suggests longer calibration cycle time, but also increases the required equipment costs necessary to accommodate dual adjustments. The second adjustment under this type of calibration procedure can be omitted if the bridge and the circuitry are matched by appropriate trimming procedures during the IC probing process. In addition, since most integrated IC sensors are provided with supply, negative and output terminations, two additional interconnections are necessary to provide pin outs for the sensor IC in order to measure the actual bridge output. The bridge output, or differential voltage across the magnetoresistive bridge, must be made available in order to monitor the bridge null voltage. This results in increased space required for the IC and additional costs, assuming that the bridge output would require buffering that is separate from the control circuitry and additional bonding pads for the necessary wiring connections. In addition, a disadvantageous increase in EMI and RFI susceptibility can result because the bridge output connections are exposed to the outside world through wire bonds, pins, traces and pads which act like antennae that receive the various types of interference signals.

Continual monitoring of the analog output from the bridge can also result in longer calibration cycle times. This type of calibration procedure requires that the bridge output be read, compared to a previously determined null voltage that varies from sensor to sensor, and tripped through a digital logic circuit that ultimately ceases the movement of a magnet relative to the magnetically sensitive component. In addition, the analog bridge output is significantly lower than system control voltages since it is measured in millivolts. Noise susceptibility in a calibration system of this type would naturally be increased unless the analog output is sufficiently filtered. Such filtering also increases the calibration cycle time.

In the manufacture of magnetic sensors, it is important to calibrate the sensor so that it provides a predictable signal when placed in a particular position relative to a ferromagnetic object, such as a gear tooth. In automotive applications, it is particularly important to calibrate the sensor so that it reacts predictably with a preselected signal of known magnitude when an edge of a gear tooth passes through a certain position within the detecting zone of the sensor. If the sensor isn't properly calibrated, it can provide its output signal in either a premature or delayed manner and therefore not be useable in conjunction with automotive engines which require precise timing signals. When magnetic sensors are manufactured, the calibration procedure typically requires two separate processes to be followed. One process is the calibration of the magnetically sensitive component in relation to associated circuit components. In addition, the position of a permanent magnet in relation to the magnetically sensitive component must be held precisely. These calibration procedures can be both costly and time consuming. In addition, the required circuit configuration that permits the appropriate calibration measurements to be performed sometimes leads to other problems regarding susceptibility to electromagnetic interference, or EMI, and radio frequency interference, or RFI. It would therefore be beneficial if a magnetic sensor could be provided in which calibration procedures are simplified by permitting the magnet to be moved relative to the magnetically sensitive component during the calibration process and then rigidly holding the magnet in position until it can be permanently fixed within a sensor structure.

SUMMARY OF THE INVENTION

In a preferred embodiment of the present invention, a magnetic sensor with an adjustable magnet position comprises a carrier having a cavity formed therein. It also comprises a plurality of electrical leads that are molded into the carrier. The cavity is shaped to receive the permanent magnet within it and the magnet is shaped to slide into the cavity in response to an external force. The present invention also comprises a means associated with the cavity for guiding the magnet along a preselected axis as the magnet slides into the cavity in response to the external force. A preferred embodiment of the present invention also comprises a means associated with the cavity for resisting the magnet as the magnet slides into the cavity in response to the external force. The resisting means is deformable in response to forcible contact with the magnet as the magnet slides into the cavity in response to the external force. The resisting means is shaped to retain the magnet in position within the cavity when the external force is not exerted against the magnet. In addition, the present invention also comprises a magnetically sensitive component and a substrate. The magnetically sensitive component is attached to the substrate and the substrate is attached to the carrier.

In a particularly preferred embodiment of the present invention, the carrier is made of molded plastic and the magnet is a permanent magnet. The guiding means comprises a plurality of protrusions formed in the walls of the cavity. The plurality of protrusions can comprise a plurality of ribs. The plurality of ribs can be aligned in parallel association with the preselected axis along which the magnet moves as it slides into the cavity. The resisting means can comprise a deformable rib. The magnetically sensitive component, in a particularly preferred embodiment of the present invention, comprises a plurality of magnetoresistive elements arranged in a bridge configuration. The present invention can further comprise a plurality of electrical components attached to the substrate and connected in electrical communication with the magnetically sensitive component. In addition, the plurality of electrical leads can extend through the carrier and be connected in electrical communication with the magnetically sensitive component.

In one particularly preferred embodiment of the present invention, the carrier, the substrate, the magnet and the magnetically sensitive component are encapsulated within an overmolded structure.

BRIEF DESCRIPTION OF THE DRAWINGS

The present invention will be more fully and completely understood from a reading of the Description of the Preferred Embodiment in conjunction with the drawings, in which:

FIGS. 1 and 2 are schematic illustrations of magnetoresistive elements attached to a platform;

FIG. 3 shows the sensor assembly of FIGS. 1 and 2 associated with a permanent magnet;

DESCRIPTION OF THE PREFERRED EMBODIMENT

Figure 4:
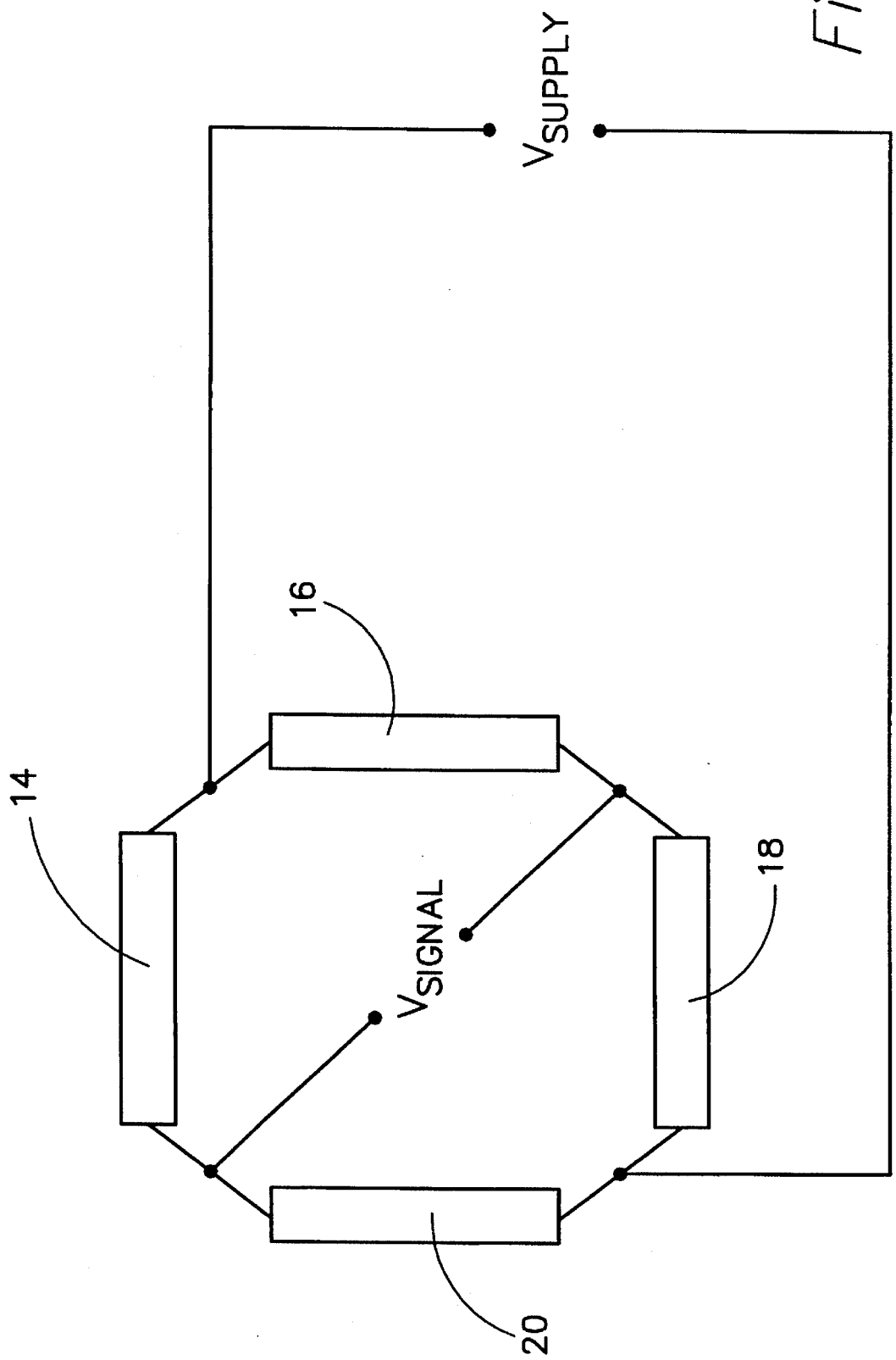
FIG. 4 is a bridge structure formed by a plurality of magnetoresistive elements and a voltage supply.

Throughout the Description of the Preferred Embodiment, like components will be identified by like reference numerals.

FIG. 1 illustrates a schematic representation of a sensor arrangement 10 that disposes a group of magnetoresistive elements on a substrate 12. The magnetoresistive elements are identified by reference numerals 14, 16, 18 and 20. The electrical connections between the magnetoresistive elements are not illustrated in FIG. 1 because of the schematic nature of the drawing. However, the electrical connection between the magnetoresistive elements will be described in greater detail below in conjunction with FIG. 4. The magnetoresistive elements are disposed on the substrate 12 to permit them to be located relative to a magnet.

FIG. 2 shows a side view of the sensor arrangement 10. It should be understood that the magnetoresistive elements, in a preferred embodiment of the present invention, are thin film structures deposited on the upper surface of the substrate 12. In addition, although the magnetoresistive elements are illustrated as simplified box illustrations in FIGS. 1 and 2, they are typically serpentine patterns of interleaved strips of permalloy material. Although the interleaving is not an absolute requirement in sensors of this type, it increases the likelihood that magnetoresistors 14 and 18 will experience a similar magnetic field at the same time and, in addition, that magnetoresistor 16 and 20 will experience the same magnetic field at the same time.

FIG. 3 illustrates the sensor arrangement 10 disposed in the magnetic field of a magnet 24. The magnet 24 is a permanent magnet which provides a magnetic field that is illustrated schematically by the arrows in FIG. 3. Because of the electrical connection of the magnetoresistors, a symmetrical position of the sensor arrangement 10 within the magnetic field will provide a generally balanced signal.

FIG. 4 shows the four magnetoresistive elements connected in a bridge arrangement. A supply voltage $V_{SUPPLY}$ is connected across the bridge as shown and a signal voltage $V_{SIGNAL}$ can be monitored at the circuit positions illustrated in FIG. 4. This arrangement improves the sensitivity of the magnetoresistive sensor arrangement. For example, if the magnetic field that is affecting magnetoresistive elements 14 and 18 increases in relation to the magnetic field affecting magnetoresistors 16 and 20, that difference is emphasized by the electrical connection of the bridge arrangement shown in FIG. 4. The use of magnetoresistive elements in gear tooth sensors is well known to those skilled in the art as described above in the discussion of the prior art.

Figure 6:
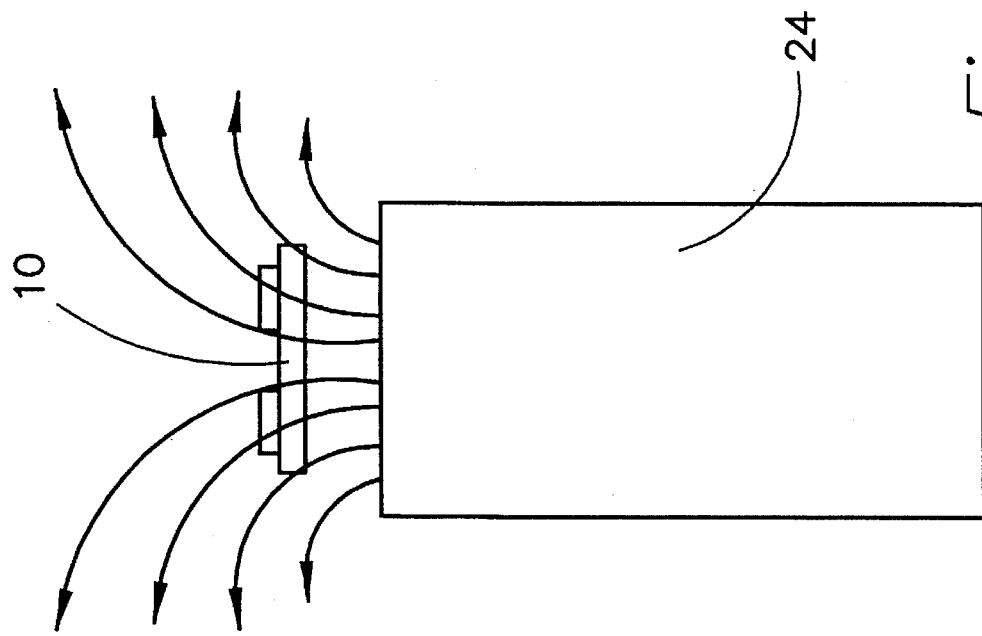
FIGS. 5 and 6 show the sensor assembly at various positions relative to a permanent magnet.
Figure 5:
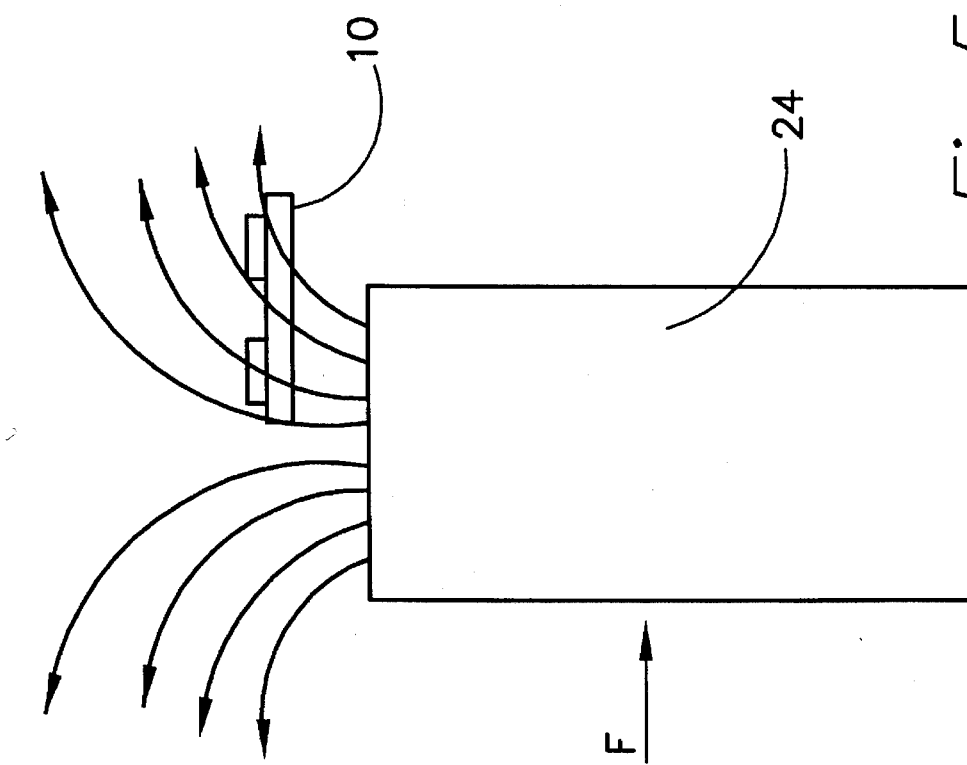

FIGS. 5 and 6 illustrate the type of calibration that the present invention enhances. In FIG. 5, the sensor arrangement 10 is in a nonsymmetrical association with the magnetic field provided by the magnet 24. Although it should be understood that the situation shown in FIG. 5 is exaggerated, it can be realized that this type of association between the sensor arrangement 10 and the permanent magnet 24 would provide a distorted signal because of the nonsymmetrical arrangement. Since many types of gear tooth sensors require a zero crossing detection scheme, the situation presented in FIG. 5 would be significantly disadvantageous because of the unipolar nature of the magnetic effects on all of the magnetoresistive elements. As can be seen in FIG. 5, the lines of magnetic flux affect all of the magnetoresistors in the same direction. Since magnetoresistive elements are particularly sensitive to the component of magnetic field within the plane of the sensor itself, it can be seen that the horizontal component of magnetic field affecting all of the magnetoresistors shown in FIG. 5 would be in a direction toward the right. This is disadvantageous in sensors which strive to achieve a bipolar relationship between the magnetoresistive elements and the magnet.

With continued reference to FIG. 5, it can be seen that an external force F could be used to move the magnet 24 toward the right in relation to the location of the sensor arrangement 10. If that movement of the magnet 24 is achieved through the application of the external force F, the relative position shown in FIG. 6 could be achieved. It should be understood that the goal of the present invention is not necessarily to achieve physical symmetry between the sensor arrangement 10 and the central axis of the magnet 24. Instead, the intention of the present invention is to locate the magnet 24 in relation to the sensor arrangement 10 at a position which provides a predetermined signal output from the magnetoresistive elements. In other words, if a slight non-zero null exists in the magnetoresistive bridge and related components, the position of the magnet 24 could be placed at a location that is not physically symmetrical with the magnetoresistive elements but, instead, achieves a desired output as a function of the position of the magnet with the magnetoresistive elements and the other factors that may cause a bridge structure that is not completely balanced.

Figure 7:
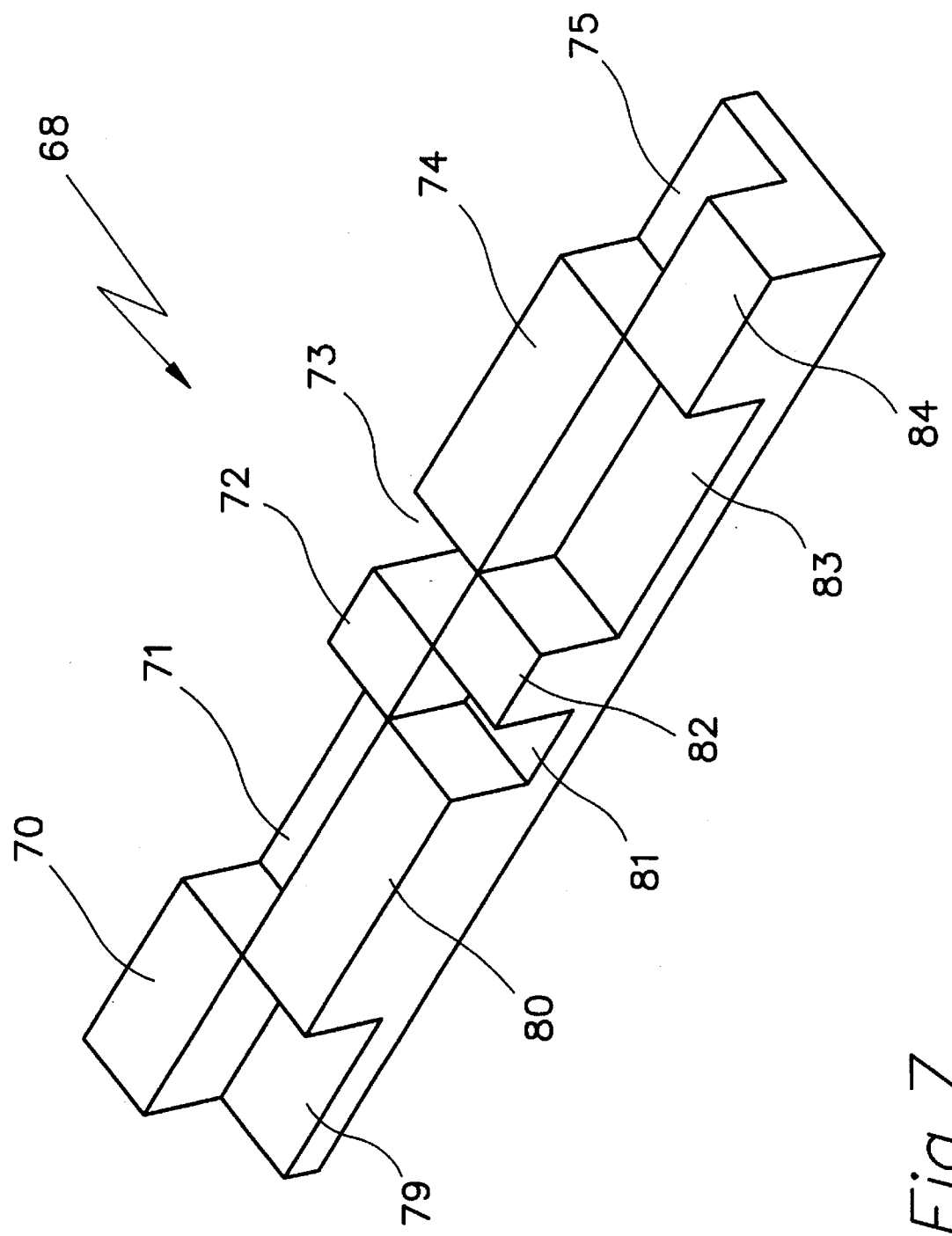
FIG. 7 illustrates a target used in conjunction with the present invention.

The present invention is particularly intended for use in association with a ferromagnetic target that comprises a plurality of gear teeth and interstitial spaces. More specifically, a particularly preferred embodiment of the present invention is intended for use with a rotatable target that comprises two tracks of complementary target elements. FIG. 7 illustrates a linear arrangement of teeth and interstitial spaces that comprises two complementary target tracks. Although the configuration shown in FIG. 7 is linear and not arranged in a circular pattern, such as a rotatable gear, it should be understood that the effect on the magnetic sensor is essentially identical whether the complementary targets are arrangement in a linear pattern or around the circumference of a rotatable member. The component shown in FIG. 7 comprises a first target track that, in turn, comprises teeth 70, 72 and 74. In between those teeth are interstitial spaces 71, 73 and 75. The other target track comprises teeth 80, 82 and 84. In between those teeth of the second track are interstitial spaces 79, 81 and 83. The two target tracks are complementary to each other. In other words, every tooth in the first target track is disposed alongside a space of the second target track. Furthermore, every tooth in the second target track is disposed alongside a space in the first target track. This type of arrangement is known to those skilled in the art and is described in particular detail in U.S. patent application Ser. No. 08/099,296 which was filed by Wu on Jul. 7, 1993. The component shown in FIG. 7 can be used in association with a magnetic sensor to calibrate the sensor by simulating an actual target with which the sensor will be associated after it is manufactured and assembled in equipment.

Figure 8:
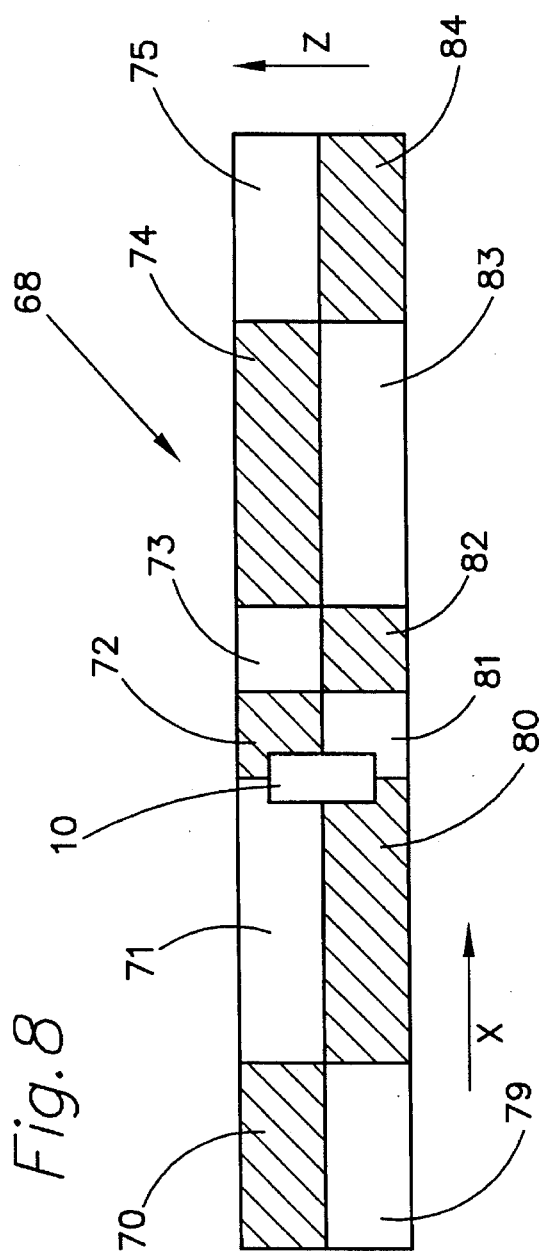
FIGS. 8, 9 and 10 shows three views of the target illustrated in FIG. 7.
Figure 9:
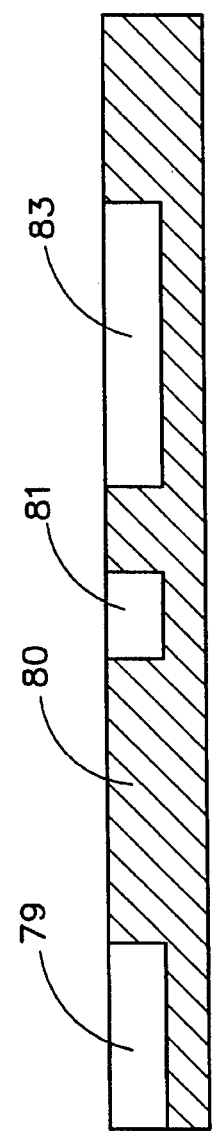

FIGS. 8 and 9 illustrate two views of the target 68 described above in conjunction with FIG. 7. It is made of a ferromagnetic material and is intended to simulate the teeth and interstitial spaces of a rotatable complementary target. In FIG. 8, a sensor arrangement 10 is shown disposed and facing above a transition position of both target tracks. In other words, the magnetically sensitive components attached to the sensor arrangement 10, although not illustrated in FIG. 8 are disposed over the transition lines between tooth 72 and space 71 and between tooth 80 and space 81. When placed in this location, a particular signal is expected from the bridge arrangement of magnetoresistive elements.

Figure 10:
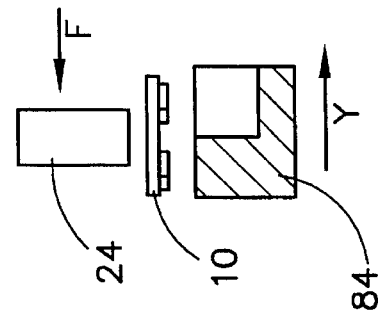

FIG. 10 shows an end view of the target 68 with the sensor arrangement 10 disposed over the target. Magnet 24 is illustrated in relation to the sensor arrangement 10. Arrow F represents a force in a possible direction of movement of magnet 24 in relation to the sensor arrangement 10.

During the calibration process made possible by the present invention, the magnetoresistive elements are disposed at a preselected position in relation to the target 68 and the magnet 24 is moved by an external force F until a particular signal is received from the sensor. When the signal is received, the external force F is removed and the magnet 24 is held in the precise position where it was located when the force was removed. The magnet is held in that position while further manufacturing processes are performed on the sensor. One of those processes can be the encapsulation of the entire structure of magnetoresistive elements, a carrier, and the magnet within an encapsulated plastic structure. When this encapsulation is performed, the position of the magnet 24 is permanently held in place at the location where the magnet was when it caused the desired signal to be received from the sensor during the calibration process.

Figure 11:
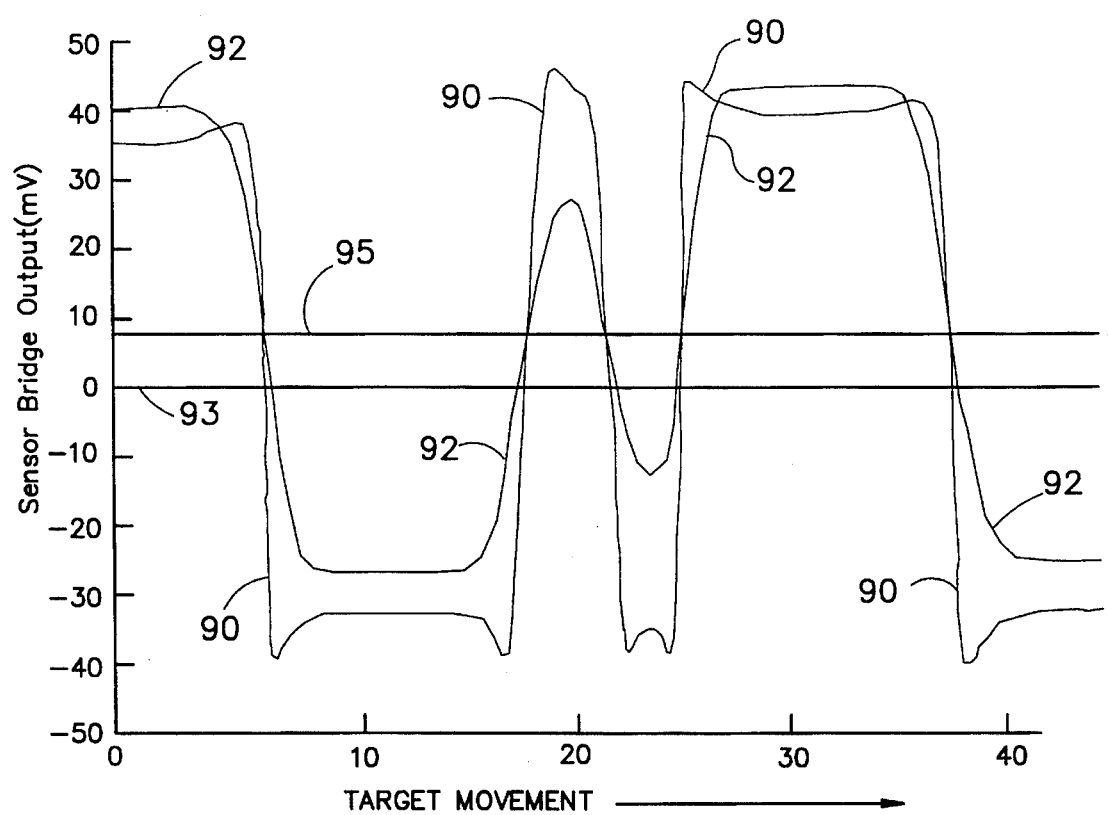
FIG. 11 shows the types of bridge output signals provided by the bridge shown in FIG. 4 for two gaps between the sensor and a target.

It should be understood that a typical application of a magnetic sensor is a gear tooth sensor in a automobile engine. The purpose of the gear tooth sensor in an automobile engine is to detect the passage of teeth and interstitial spaces of a rotatable target and provide signals at the precise moment when the edge of a tooth passes through a preselected position within the detection zone of the sensor. This type of precise position detection is required in applications where the gear tooth sensor is used to provide timing signals to a microprocessor that controls the operation of the engine. Several problems can occur during the assembly of the gear tooth sensor into the engine. In most applications of this kind, the gear tooth sensor is disposed with its distal end proximate the outer circumference of the teeth of a gear. The spacing between the distal end of the magnetic sensor and the teeth will therefore determine the output signal timing to a certain degree. In other words, if the distal end of the sensor is too close to the gear the output signal timing will be affected. Similarly, if the distal end of the geartooth sensor is too far from the gear, the timing will also be effected. As an example, FIG. 11 illustrates the signal output, $V_{SIGNAL}$, in FIG. 4. The pattern illustrated in FIG. 11 is the bridge output of an arrangement such as that shown in FIG. 4 when the distal end of the magnetic sensor is disposed at two different gap positions. Curve 90 is the output of the bridge when the distal end of the magnetic sensor is disposed with a gap of 0.004 inches between it and the outer surface of the gear. Curve 92 represents a similar pattern of signals when the distal end is disposed at a gap of 0.049 inches from the outer surface of the gear. As can be seen, the two signal patterns are not identical to each other. However, since most automotive applications require the ability of the magnetic sensor to operate within a range of gaps, steps must be taken to assure that the signals provided by the magnetic sensor are appropriate for any position within the range of gaps.

With continued reference to FIG. 11, it can be seen that curves 90 and 92 cross each time they change from a positive output signal to a negative output signal. Those crossings of curves 90 and 92 don't coincide perfectly with the crossings of those two signals with the zero magnitude axis 93 in FIG. 11. If the circuit null value coincides with the magnitude of sensor bridge output where curves 90 and 92 cross each other at line 95, errors due to air gap misplacement are minimized. As will be described in greater detail below, the present invention provides the ability to move the magnet relative to the magnetoresistive elements in such a way that, during calibration, the effects on the zero crossing positions of the curves in FIG. 11 will be provided in an advantageous manner.

Figure 12:
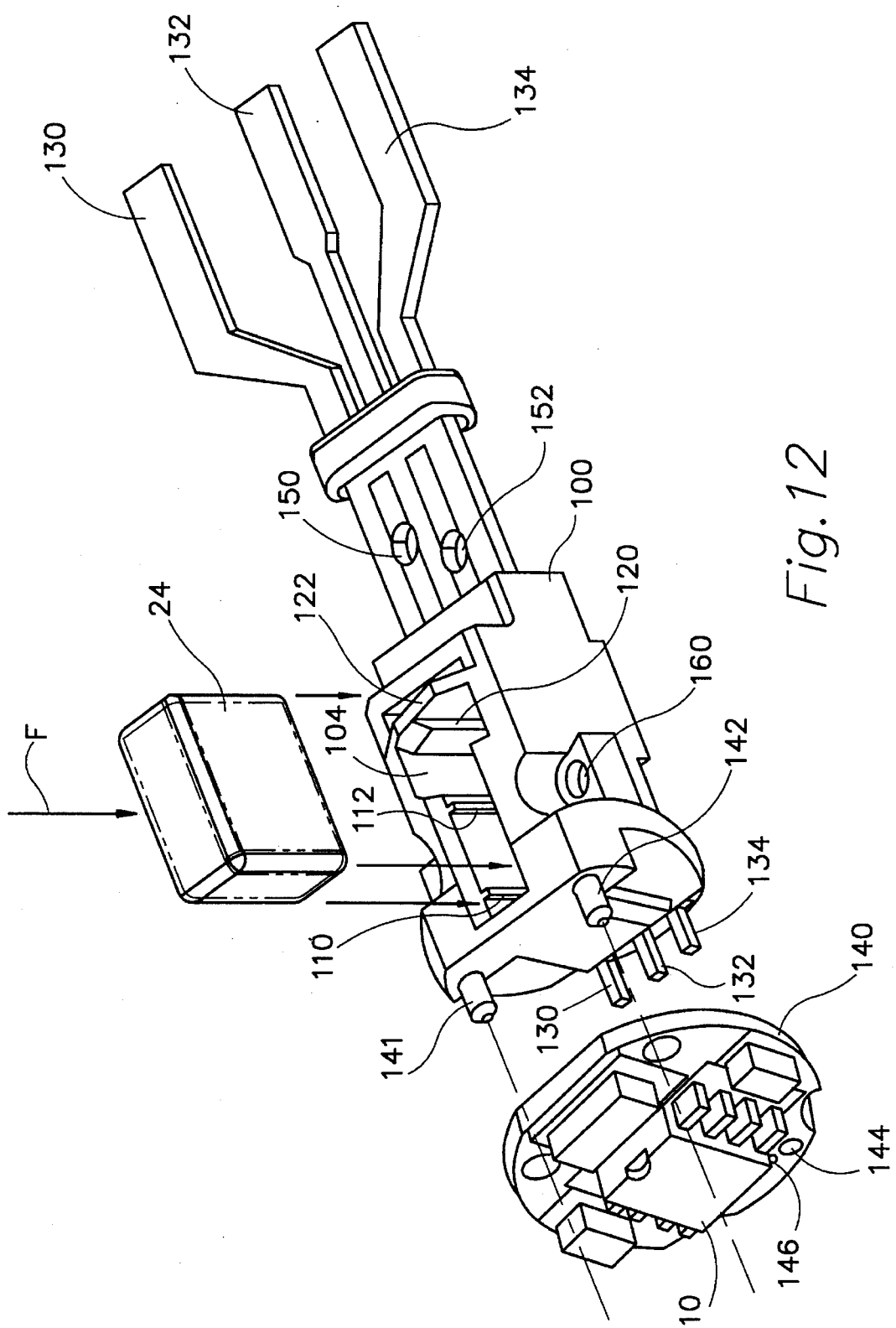
FIG. 12 is an exploded view of a preferred embodiment of the present invention.

In order to move the magnet 24 under the influence of an external force and to have the magnet retain its position when the external force is removed following calibration, the present invention provides means, within its cavity, to guide the movement of the magnet along a first axis and then retain the position of the magnet when the force is removed. FIG. 12 shows a preferred embodiment of the present invention in an exploded view. A carrier 100 is provided with a cavity 104 which is formed therein. The cavity 104 is shaped to receive the magnet 24 as the magnet is pushed into the cavity in response to an external force F. A means is provided for guiding the magnet 24 along a preselected axis as the magnet slides into the cavity 104 in response to the external force F. In FIG. 12, the guiding means comprises protrusions, 110 and 112, that are formed in a wall of the cavity 104. The preselected axis, although not illustrated in FIG. 12, is vertical and is parallel to the direction of the external force F. The purpose of the guiding means will be described in greater detail below. The present invention also provides a means, associated with the cavity 104, for resisting the movement of the magnet as it slides into the cavity 104. In a particularly preferred embodiment of the present invention, the resisting means comprises a deformable rib 120. The deformable rib 120 is crushed by the magnet 24 as it moves into the cavity 104. The deformation of the rib 120 assures that the magnet 24 will be in an interference fit relationship with the cavity as it moves downward in FIG. 12. Because of the deformable rib 120, the magnet 24 will retain its instantaneous position when the external force F is removed. In some embodiments of the present invention, the carrier 100 is also provided with a thin flexible wall 122 which cooperates with the deformable rib 120 to maintain a compressive force against the magnet 24 as it slides into the cavity 104. It should be understood, however, that the thin flexible wall 122 is not a requirement in all embodiments of the present invention.

With continued reference to FIG. 12, a plurality of electrically conductive leads, 130, 132 and 134 are molded within the body of the carrier 100 and extend through the carrier. A substrate 140 is attachable to the carrier 100 through the use of plastic pegs, 141 and 142, which can extend through holes in the substrate 140 as shown. After the substrate 140 is placed in contact with the end of the carrier 100 and the plastic pegs are inserted through their associated holes in the substrate 140, the plastic pegs can be melted by the application of heat to permanently attached the substrate to the carrier. Three holes are formed in the substrate 140 for receiving the electrically conductive leads therethrough. Two of those holes, 144 and 146, are illustrated in the exploded view. In other words, electrically conductive lead 134 extends through hole 144 and electrically conductivity lead 132 extends through hole 146. Another hole, which is not shown in FIG. 12, receives electrically conductive lead 130. After the assembly of the substrate 140 to the carrier 100, the three electrically conductive leads are soldered in place to provide electrical communication between the electrical leads and components which are attached to the substrate 140. Sensor arrangement 10 is attached to the substrate 140 and connected in electrical communication with a plurality of electrical components that are also attached to the substrate. The electrically conductive leads, 130, 132 and 134, are therefore connected in electrical communication with the sensor arrangement 10 and the associated electrical components on the substrate. Holes 150 and 152 are provided to create a bond between the thermoset overmold material and conductive leads, 130, 132 and 134, to protect the carrier 100, magnet 24, substrate 140, and electrical components from the outside environment. Hole 160 in the carrier is provided for positioning the carrier in a thermoset mold.

With continued reference to FIG. 12, it can be seen that the structure provided within the cavity 104 of the carrier 100 allows the magnet 24 to be pushed down into the cavity by an external force until an appropriate digital signal is received from the circuitry on the substrate 140. Various circuits are known to those skilled in the art for providing a digital signal corresponding to the crossing of the bridge output and threshold magnitudes. When that digital signal is received, the external force F can be immediately removed and the magnet 24 will retain its position accurately within the cavity at the precise location which resulted in the signal from the circuitry.

Figure 13:
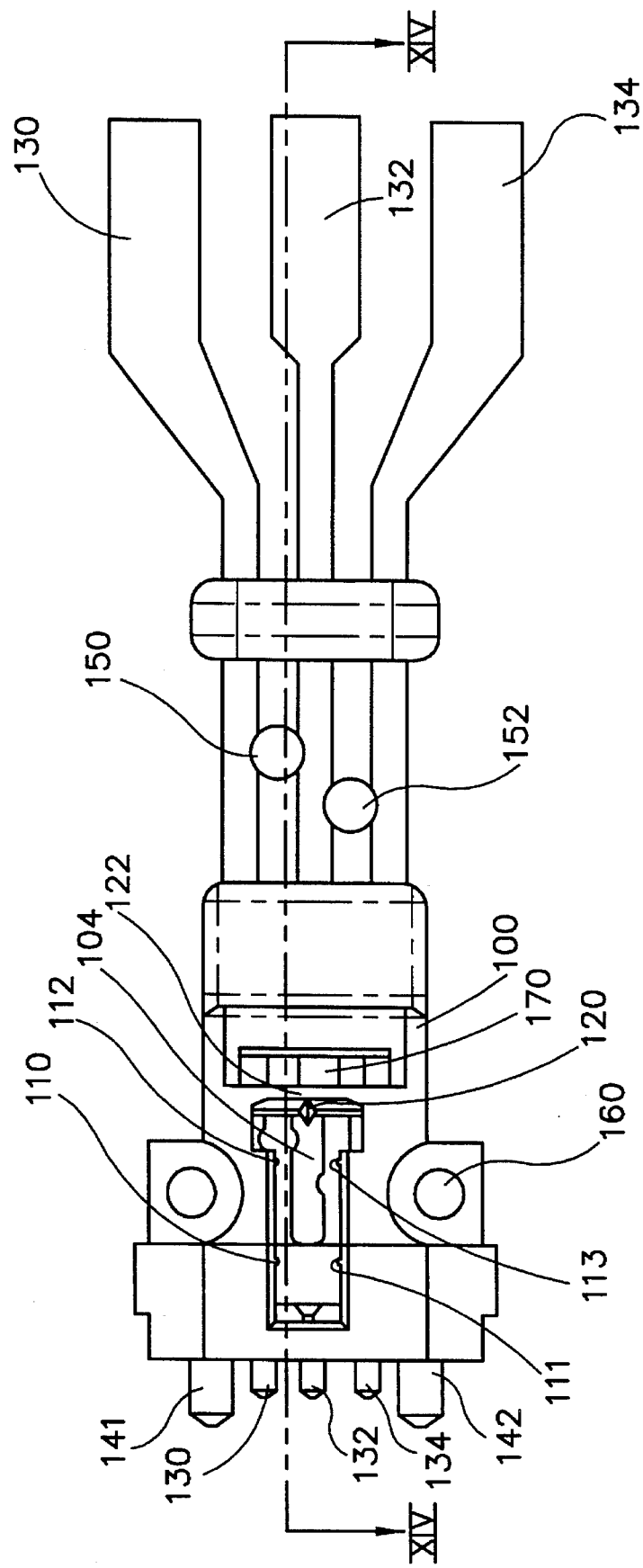
FIG. 13 is a top view of the present invention.

FIG. 13 shows a top view of the carrier 100. As shown in FIG. 13, the electrically conductive leads, 130, 132 and 134, extend through the carrier 100 and are molded therein. The cavity 104 has four ribs, 110-113, which serve the purpose of guiding the magnet as it is forced downward into the cavity by the external force. The deformable rib 120 provides the means for resisting the movement of the magnet 24 (not shown in FIG. 13) as it is pushed downward into the cavity 104. As described above, the flexible wall 122 is formed between the cavity 104 and an opening 170. The flexible wall 122 is deformable and can be moved toward the opening 170 by the force of the magnet 24 against the deformable rib 120. As described above, the provision of a flexible wall 122 is not a requirement of the present invention.

Figure 14:
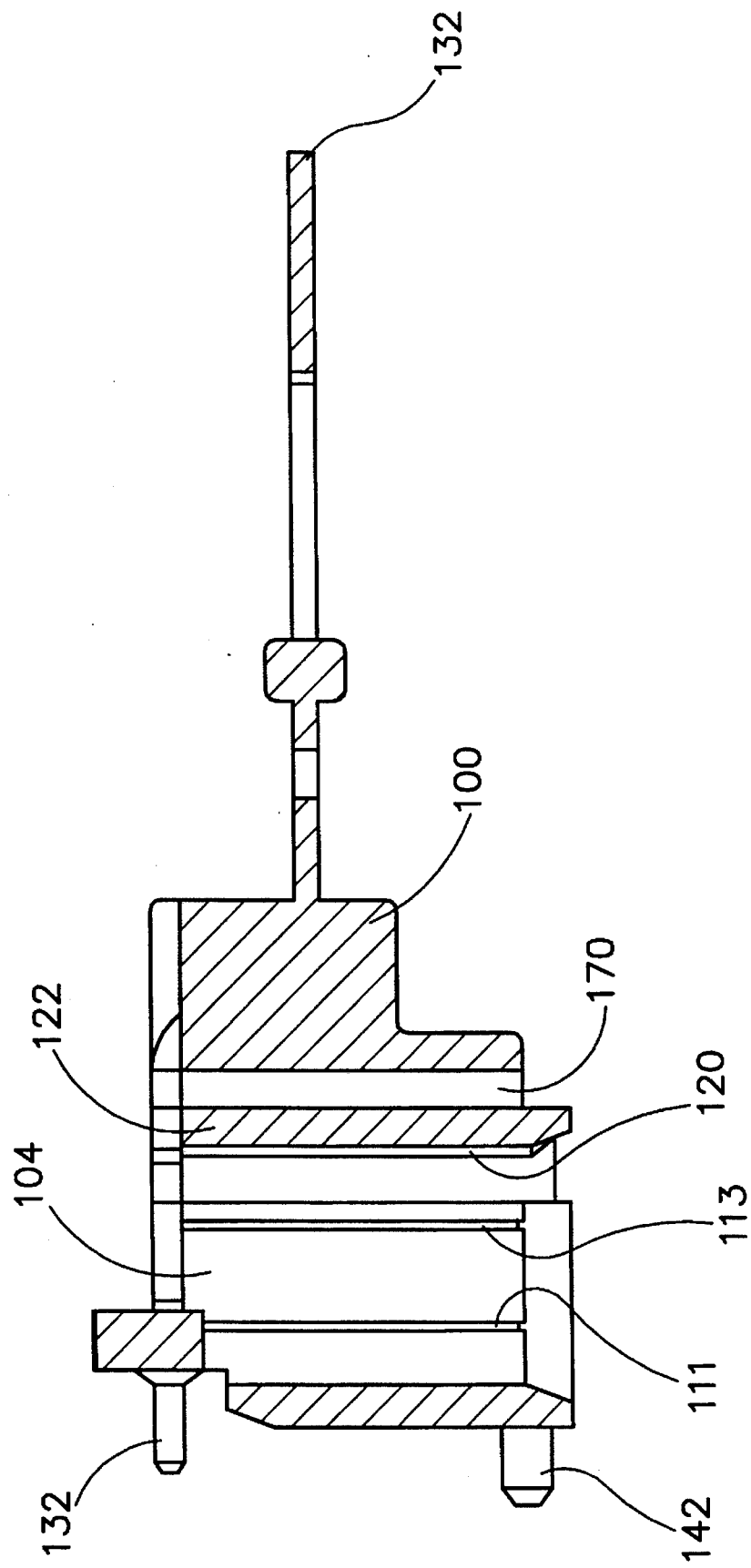
FIG. 14 is a section view of the device shown in FIG. 13.

FIG. 14 is a section view of the illustration in FIG. 13. It shows the relative placement of the guiding ribs, 111 and 113, with respect to the cavity 104 and the deformable rib 120. In addition, the flexible wall 122 is shown in its position between the cavity 104 and opening 170. Although not particularly illustrated in FIGS. 13 and 14, it should be understood that the electrically conductive leads are bent as they pass through the body of the carrier 100. This is provided for two reasons. First, the bend in the electrically conductive leads provides the placement of one end of the leads at a particular location to fit the openings in the substrate while placing the opposite ends of the three leads at appropriate positions for attachment to external components. In addition, the double bend provided in the leads provides an added measure of sealing by providing a tortuous path along which fluids do not easily pass in the interface between the metallic leads and the plastic body of the carrier 100.

With continued reference to FIG. 14, it can be seen that the upward movement of a magnet into the cavity 104 shown in FIG. 14 causes the deformable rib 120 to deform. In addition, the flexible wall 122 can flex into opening 170 and provide a compressive force against the magnet in a direction toward the left in FIG. 14. The combination of the deformable rib 120 and the flexible wall 122 seizes the magnet in place when the external force is removed. The ceasing of the magnet in this manner retains it accurately in its position that it held when the external force is removed.

Figure 15:
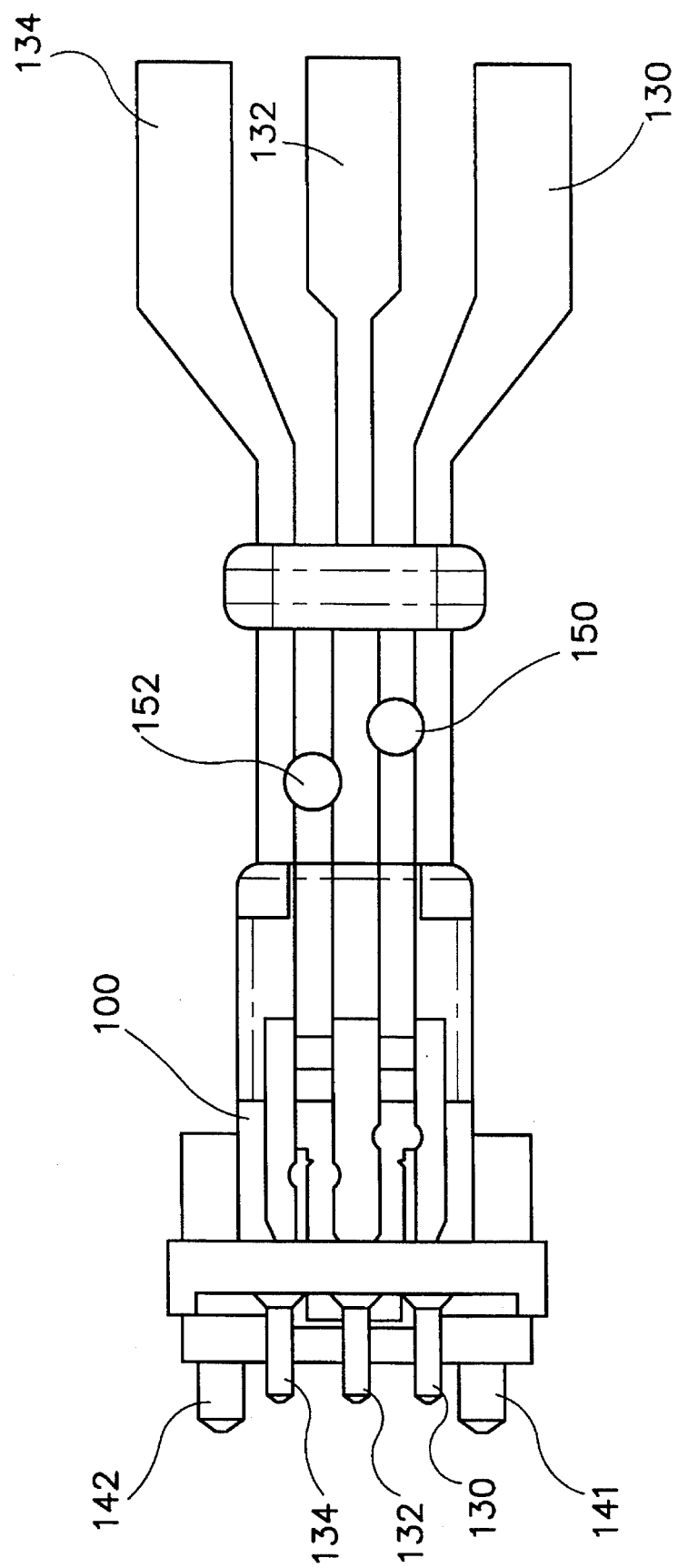
FIG. 15 is a bottom view of the device shown in FIG. 13.

FIG. 15 shows a bottom view of the present invention as illustrated in FIG. 13. It shows the relative positions of the electrically conductive leads, 130, 132 and 134, and also illustrates the relative positions of the plastic pegs, 141 and 142.

Figure 16:
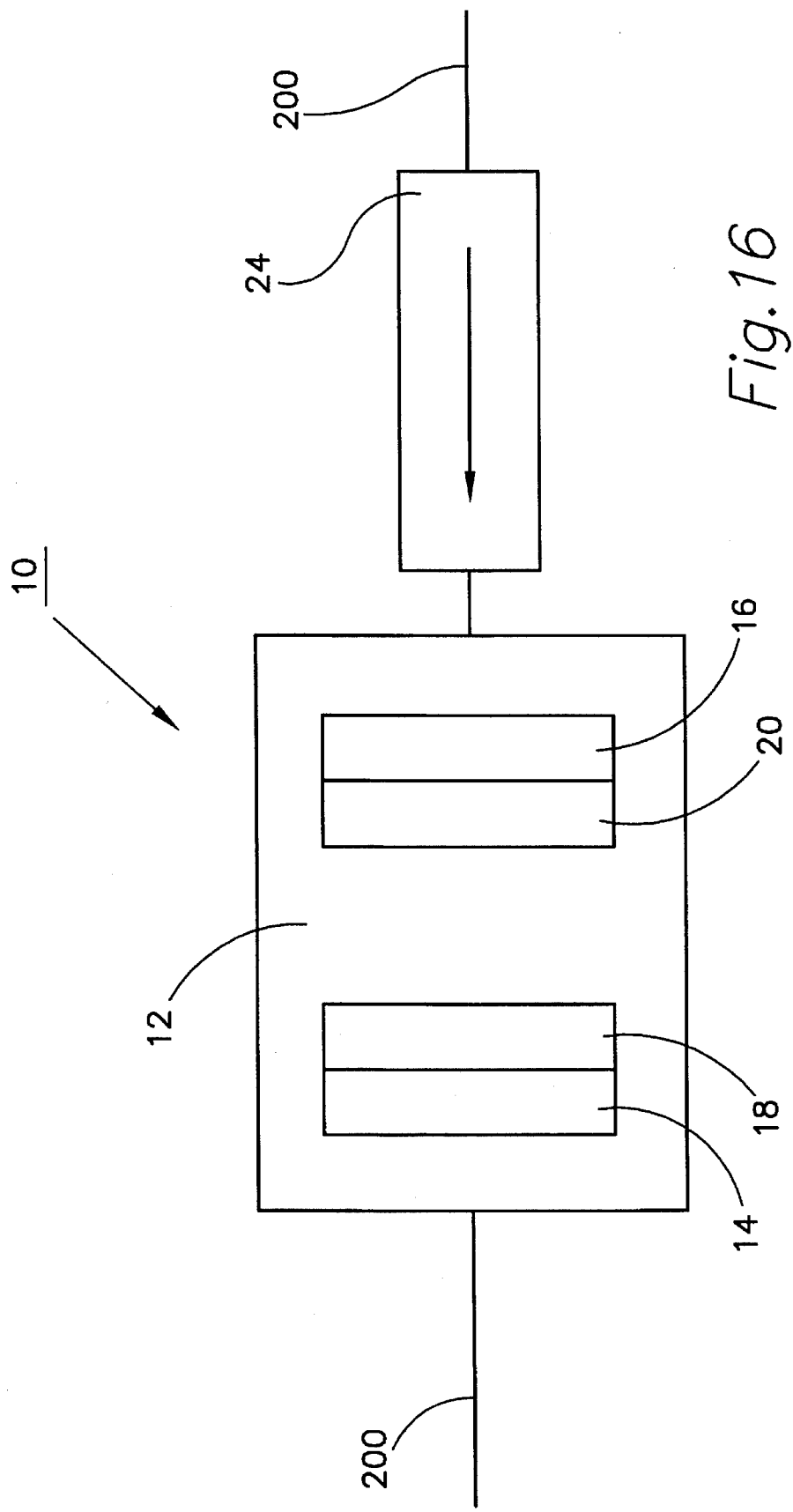
FIG. 16 shows the necessity for moving a magnet along a precise axis relative to the sensor assembly.

FIG. 16 is a schematic illustration of the sensor arrangement 10 and magnet 24. The purpose of FIG. 16 is to illustrate the importance of assuring that the magnet 24 moves in a direction along a preselected axis 200. The ribs, 110–113, are provided in the cavity 104 for the purpose of assuring this proper movement. If the magnet 24 is not moved in the direction represented by the arrow on the magnet in FIG. 16, the desired effects on the output signal from the bridge formed by the magnetoresistive elements, 14, 16, 18 and 20, will not be achieved. The four ribs provided in the cavity 104 of the carrier are the means for guiding the magnet in this appropriate direction along the preselected axis 200.

Figure 17:
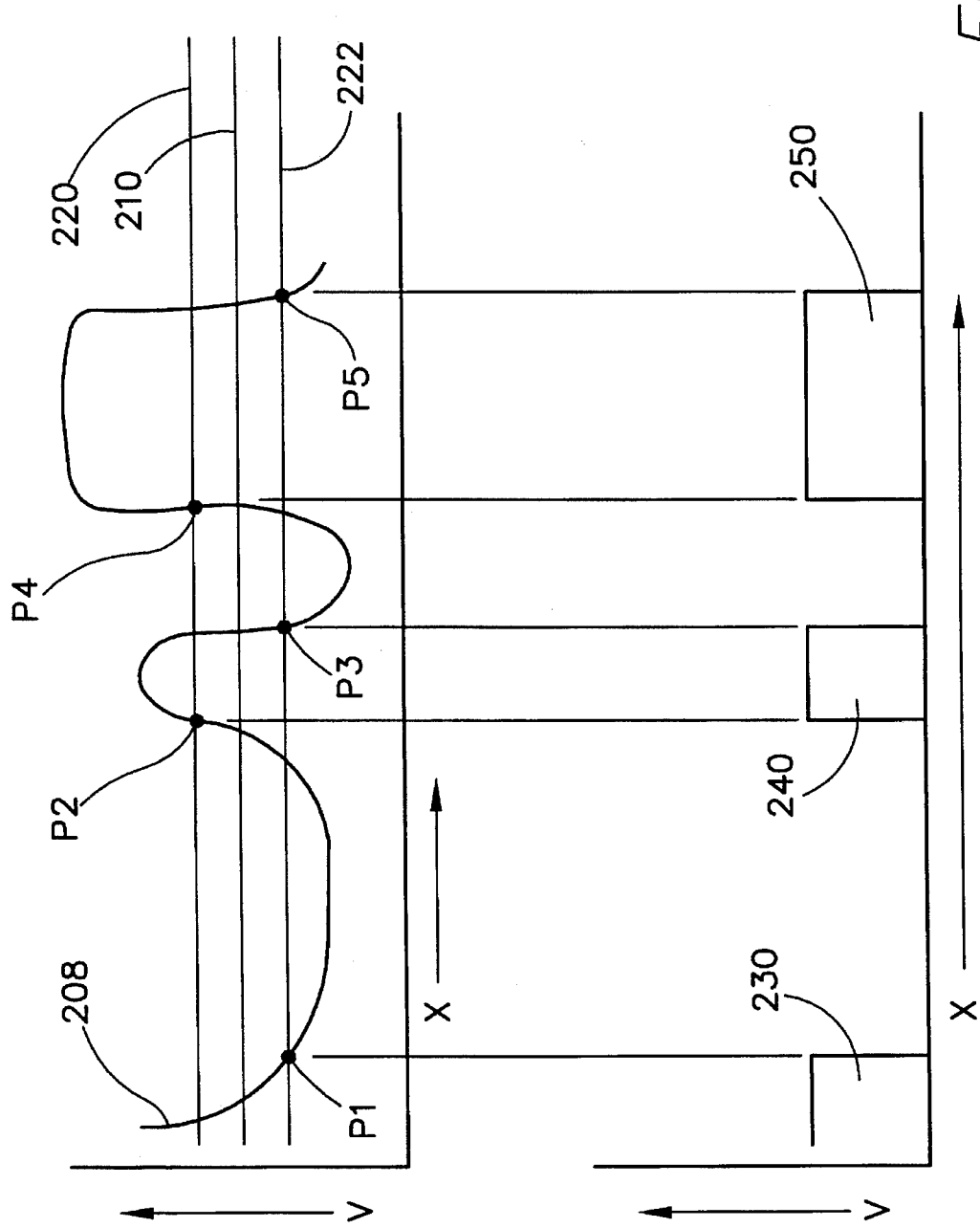
FIG. 17 illustrates an exemplary output signal from the bridge in FIG. 4 along with a digital output signal derived from the bridge signal.

FIG. 17 is a schematic representation of the curve which describes the output signal $V_{SIGNAL}$ that is the output from the bridge shown in FIG. 4 and described above. Since many magnetic sensors provide a digital output signal, appropriate circuitry is provided which switches from a high signal to a low signal, and vice versa, when the output signal 208 from the bridge crosses through a zero reference line. Ideally, a single reference line 210 could be used for these purposes. However, because of the existence of electrical noise in most systems, hysteresis is provided to assure that appropriate signal switching occurs. An upper threshold 220 and an lower threshold 222 are typically provided above and below the reference value 210. When signal 208 passes through the lower threshold 222, as represented by point P1, a digital output signal 230 is switched from high to low. As the signal 208 from the bridge rises and crosses the upper threshold 220, at point P2, the digital output signal 240 changes from a low state to a high state. As signal 208 continues to vary above and below the threshold values, the digital output signal continues to change. As can be seen in FIG. 17, the crossing of the lower threshold 222 at point P3 causes the signal to achieve a low status and a crossing of the upper threshold 220 at point P4 again causes the digital output signal 250 to achieve a high status. Finally, the crossing of the lower threshold 222 by the signal 208 at point P5 again causes the digital output signal to achieve a low status.

With continued reference to FIG. 17, it should be understood that the appropriate vertical positioning of the signal 208 with respect to the reference magnitude 210 and the upper and lower threshold magnitudes, 220 and 222, is a function of the null offset of the circuitry in combination with the offset provided by the position of the magnet 24 with respect to the magnetically sensitive components.

Figure 18:
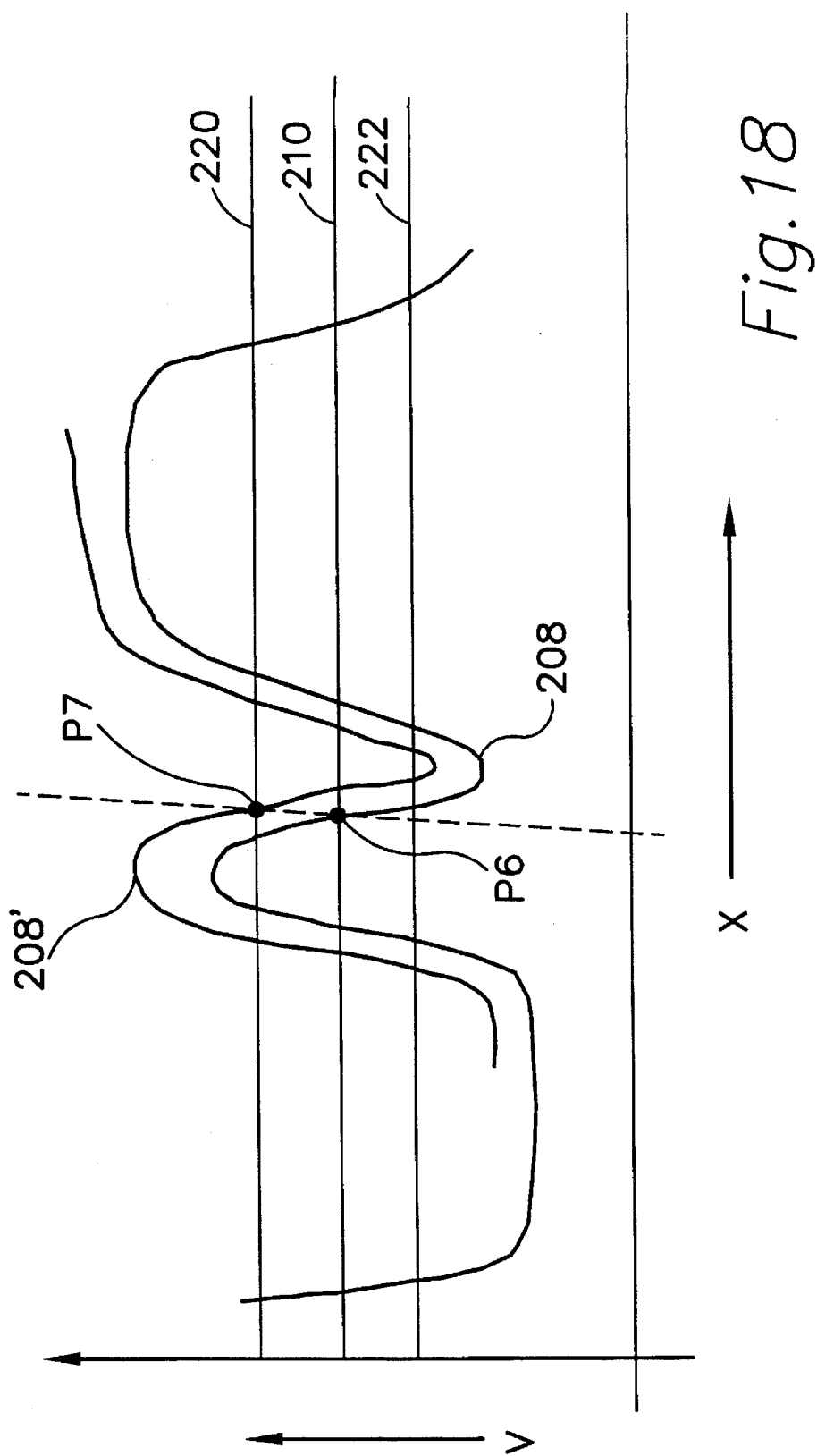
FIG. 18 illustrates the change in the bridge output signal in response to a movement of the sensor relative to a target during calibration.

FIG. 18 is a highly schematic representation of signal 208. Signal 208 is the output $V_{SIGNAL}$ of the bridge in FIG. 4 as a function of the linear position along the target 68 shown in FIG. 7. If the magnet 24 is moved along the preselected axis 200 in response to an external force F, the output signal from the bridge can be changed from that identified by reference numeral 208 to that which is identified by reference numeral 208' in FIG. 18. Therefore, by moving the magnet 24 along the preselected axis 200, the instantaneous magnitude of the output voltage from the bridge can be changed. In other words, depending on the direction in which the magnet 24 is moved, the instantaneous output signal from the bridge can be changed from that identified by P6 to that identified by P7 in FIG. 18. Although FIG. 18 is not intended to represent a precise magnitude of change of the signal $V_{SIGNAL}$, it illustrates the relative type of change that can be accomplished by moving the magnet 24 with respect to the magnetically sensitive components. The present invention allows the magnet to be moved in this manner and also provides a means for retaining the magnet accurately in its position when the external force is removed.

In the event that it becomes necessary to provide a phase shift in the calibration procedure, the relative starting positions of the magnetic sensor and the target can be shifted. If the target 68 is moved slightly in the direction along its longitudinal axis, the effect on the signal 208 can be seen in FIG. 19. In other words, the output signal can be shifted prior to any adjustment of the magnet 24 relative to the magnetically sensitive components.

Figure 20:
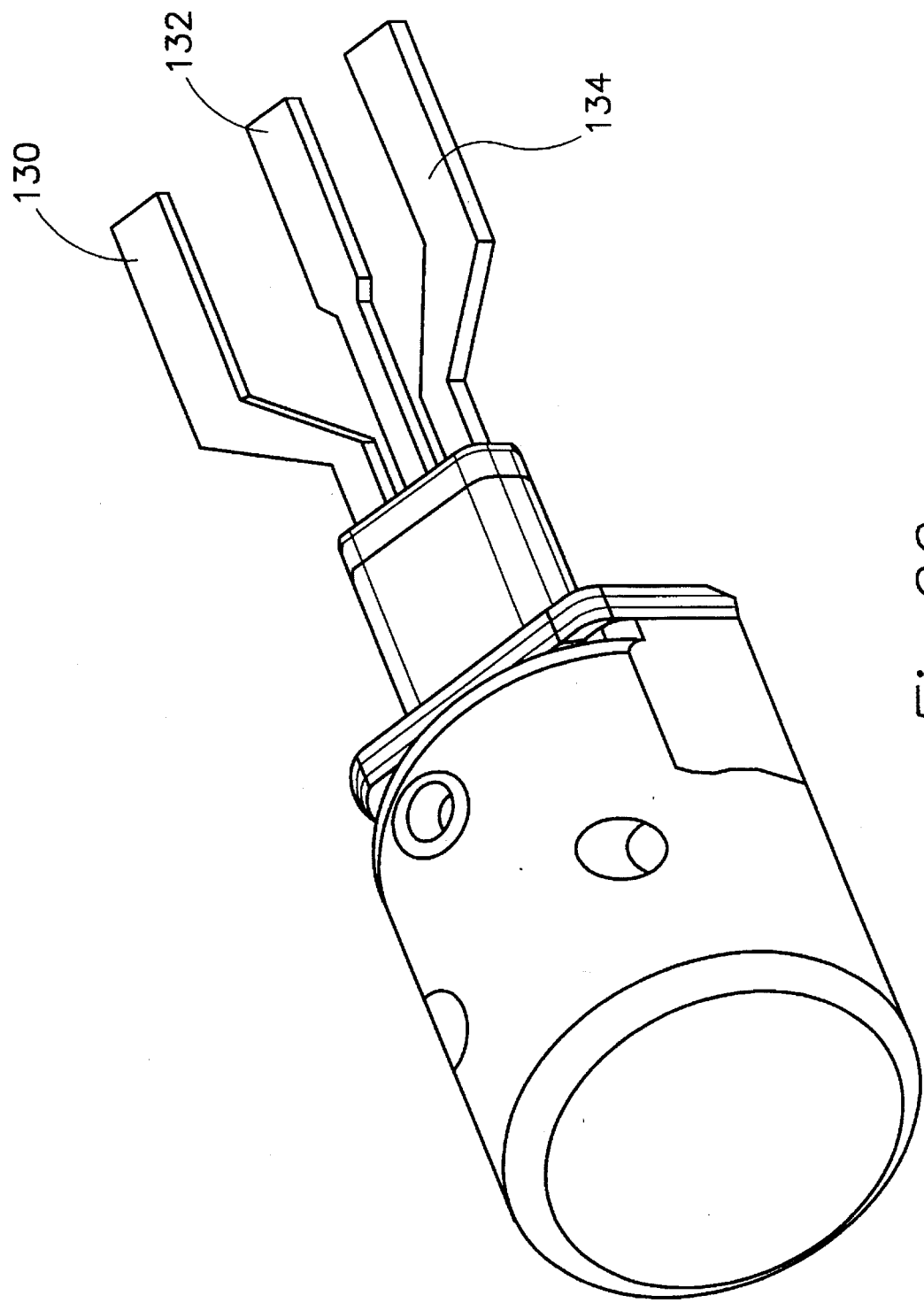
FIG. 20 illustrates the present invention after it has been overmolded.

FIG. 20 shows a magnetic sensor made in conformance with the present invention after it is encapsulated within a plastic overmolded body. In other words, after the carrier 100 is rigidly attached to the substrate 140 and the magnet 24 is inserted to its calibration depth within the cavity 104, the digital output of the circuitry is monitored to make sure that the magnet 24 is in its proper position and is held in place by the deformable rib 120, the entire assembly can be overmolded through the use of known techniques. The thermoset epoxy compound used to overmold the magnetic sensor then retains the magnet in its calibration position.

The structure provided by the present invention permits a calibration procedure to be performed in a manner that would not be possible otherwise. That calibration procedure will be described below in conjunction with the various components and configurations that were discussed above.

In order to obtain the most accurate sensor characteristics in a magnetic sensor, fine adjustments generally must be made. The adjustment of a magnetoresistive sensor bridge is most directly done by moving a magnet relative to the magnetoresistive bridge. Since the magnetoresistive bridge is extremely sensitive and its output is measured in millivolts, the precise location of the magnet is critical if high accuracy is to be achieved. In order to achieve this type of calibration of a magnetic sensor and then to assure that the calibration result is permanent, a combination of an interference fit between the magnet 24 and a carrier 100 is provided and a thermoset overmolding is also used. As an initial step, the die which contains the magnetoresistive bridge is molded into an integrated circuit package. This package is illustrated in FIG. 12 and is shown attached to the substrate 140. The package contains the sensor arrangement 10. The integrated circuit package is then soldered to a printed circuit board, such as the substrate 140, along with other components and lead traces to provide the necessary sensor circuitry. The particular type of sensor circuitry used in any particular application of the present invention is not limiting the invention. In order to accurately position the magnet and the substrate 140, a molded thermoplastic carrier 100 is provided. The substrate 140 is then rigidly attached to the face of the carrier in a suitable manner such as heatstaking plastic pegs through openings in the substrate. This assures that the substrate 140 will not tip, rotate or otherwise move during subsequent handling and over molding processes. The necessary sensor terminations are then made by soldering the conductors to the board. The assembly is placed in a fixture with a transition portion of a target 68 located at the point at which the sensor is desired to provide a transition signal. This target feature is a transition between a tooth and a space on both parallel tracks. The target feature may be placed slightly off center to accommodate for known hysteresis of the sensor, as described above in conjunction with FIG. 18. The carrier is provided with a cavity 104 which is slightly larger than the dimensions of the magnet 24. At least one deformable rib 120 of thermoplastic material is provided in the cavity 104. As the magnet 24 is inserted into the cavity 104, the deformable rib 120 is crushed or sheared. This deformation of the rib results in a controllable interference fit between the cavity and the magnet 24. In order to aid in the provision of this interference fit, at least one flexible wall 122 can also be provided to support the deformable rib 120 and also allow the wall to flex outward to prevent any force being applied to the substrate in response to the insertion of the magnet 24. The magnet is inserted into the cavity and slowly indexed into the carrier through the use of a fine threaded linear screw drive which provides the external force F. The digital output of the sensor is continuously monitored as the magnet 24 is moved into the cavity 104. When the sensor provides the desired output, the magnet is no longer advanced into the cavity 104 and the external force is removed. The magnet 24 is secured in its position through the combined actions of the deformable rib 120 and the flexible wall 122.

The assembly can then be inserted and held in place within a thermoset mold using locating core pins in two holes in the carrier 100. These two holes are illustrated in FIG. 13, one of which is identified by reference numeral 160. The assembly is overmolded with thermoset epoxy material which is allowed to totally encapsulate the bridge and the magnet. This permanently locks the magnet, the magnetically sensitive component, the substrate and the carrier together. Pin retraction should occur after a sufficient amount of thermoset material has cured to hold the insert assembly in place, but before all of the thermoset material has cured in the manner that is well known to those skilled in the art. This allows the thermoset epoxy material to back fill where the core pins had been located. Thin thermoset wall sections in areas away from the core pins help the material to cure more quickly in those sections and allow the early pin retraction. The fastening of the printed circuit board and the magnet to the insert need only be strong enough to ensure that these components do not move during the handling processes and the overmolding procedures.

A calibration procedure that is made possible by the present invention utilizes a matched bridge and circuitry in an integrated design that is performed either by trimming the bridge or trimming the circuitry offset. This is accomplished by probing the IC prior to encapsulating it into a component such as that identified by reference numeral 10 in FIG. 12. Only three pin outs are required for the IC. These are the supply connection, a negative connection and a digital output connection. A calibration fixture is provided which moves the magnet 24 relative to the magnetically sensitive components until a digital output of the sensor switches state. A target 68 is used in conjunction with a fixture and the sensor is placed at a location with its magnetically sensitive components proximate a transition between a tooth and an interstitial space of the target. Since a finite hysteresis is typically used in trigger circuits like the ones used in magnetic sensors, some edge accuracy and repeatability errors in this calibration scheme can result. Because of the hysteresis described above in conjunction with FIG. 17, the magnet 24 would not be completely adjusted to the true circuit null since the digital output would be expected to trip before it reaches the actual null. In other words, the digital output would change state when the signal 208 passes the nearest threshold. These edge repeatability and accuracy errors can be reduced by spacing the complementary targets at or beyond a maximum air gap in order to attain better adjustment resolution. This is primarily due to the flatter slope of the bridge output at farther air gaps between a distal end of the sensor and the target 68. If edge repeatability error results from this adjustment to magnitudes which are not acceptable, the complementary target 68 can be adjusted in a direction along its minor width. In other words, the magnetoresistive bridge can be moved toward one of the two tracks of the target. When this is done, the IC circuitry can be induced into tripping sooner or later than the threshold value, depending on the target's axial location during the magnetic calibration. If edge accuracy also has to be adjusted, the target 68 can be moved in its longitudinal direction. This adjustment results in a phase shift in the bridge output as described above in conjunction with FIG. 19. This type of adjustment results in a phase shift in the bridge output and directly affects the edge accuracy during the calibration.

Figure 19:
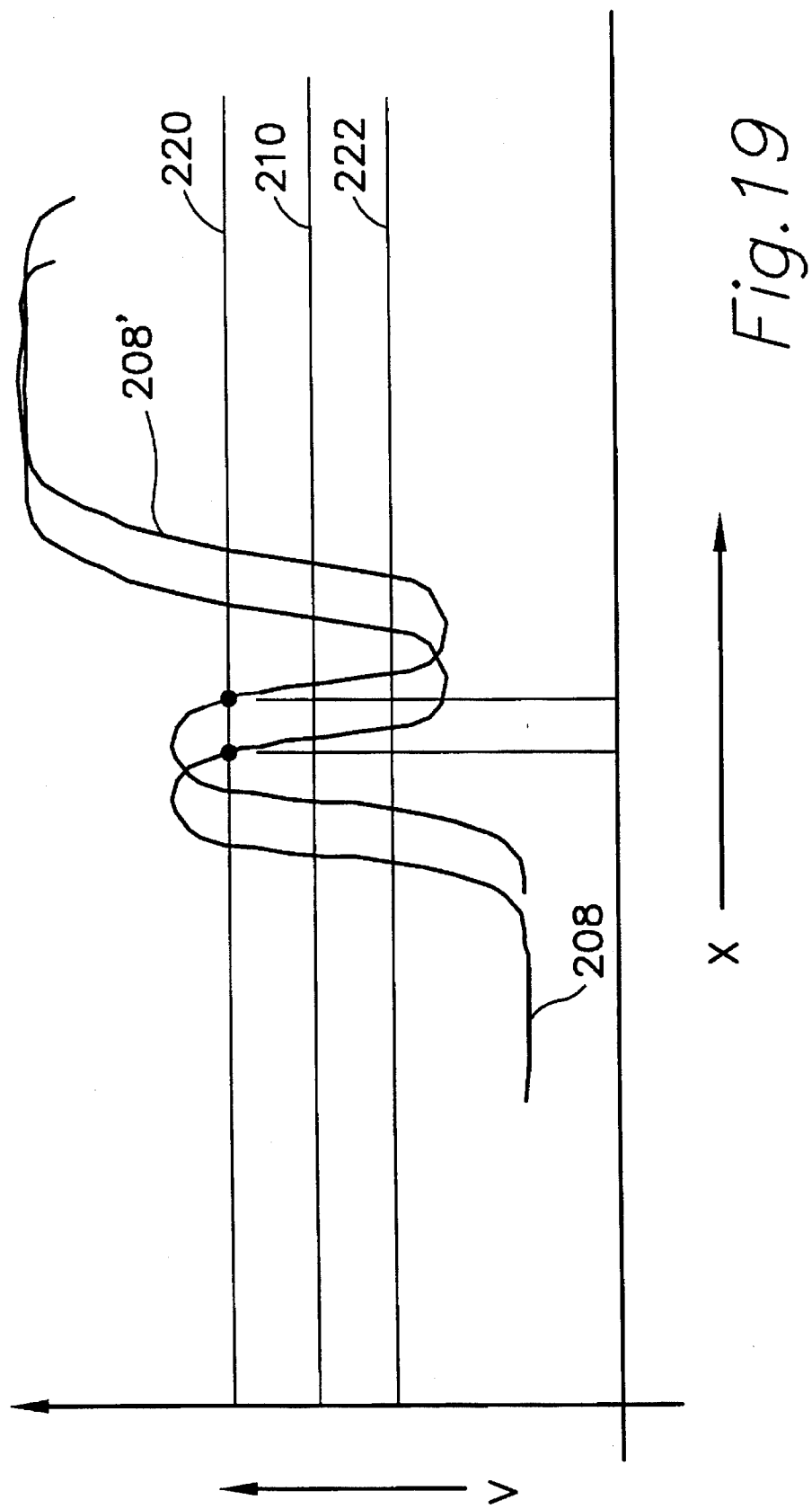
FIG. 19 illustrates an alternative movement of the sensor relative to a target during calibration.

In summary, the magnetic sensor is disposed proximate a transition region of the target 68 between the teeth and slots of both target tracks. Depending on the particular characteristics which are to be achieved, the target 68 can be moved either in its longitudinal direction as illustrated in FIG. 19 or relative to its width as illustrated in FIG. 18 prior to the adjustment of the magnet 24 relative to the carrier 100 and the magnetically sensitive components. Then, with the sensor rigidly attached in position relative to the target 68, the magnet 24 can be pushed into the cavity 104 in response to an external force until a digital output signal changes state. When the output signal changes state, the external force is immediately removed and the magnet 24 is retained in its accurate position within the cavity 104. The magnet stays in this position until the entire assembly is overmolded as described above.

The calibration procedure of the present invention is performed in a single step process. Only the supply, negative and output signals are required for use during the calibration. No additional buffering is required to isolate the bridge from the calibration circuitry and no exposed sensor bridge output antennae are introduced to the outside world. As a result, susceptibility to EMI and RFI is reduced. The calibration cycle time is significantly reduced because it is no longer necessary to monitor the actual analog output signal $V_{SIGNAL}$ as in previous calibration schemes. The digital output signal from the sensor can be used by itself to trigger the system to stop the movement of the magnet relative to the carrier 100. Since the digital output signal is used, voltage levels are much higher than the millivolt levels of the bridge output and signal-to-noise ratios are drastically improved. The output switches from supply voltage to ground to indicate a calibration match. The calibration scheme of the present invention also has the ability to actually adjust the magnetic bridge null to true zero crossing dissipate the presence of circuit hysteresis. This is done by adjusting the starting position of the target 68 relative to the sensor prior to movement of the magnet 24 relative to the housing 100. In addition, the calibration scheme of the present invention also has the capability to adjust the magnetic bridge null with respect to the fixed circuit trip points to accommodate specific applications. In other words, if an application requires that the negative edge transitions of the output signal be more accurate than the positive edge transitions, the magnetic bridge null can be adjusted more biased toward the negative threshold. This is accomplished without the need for trimming adjustment of the circuit threshold values.

The embodiments of the invention in which an exclusive property or right is claimed are defined as follows:

1. A magnetic sensor with adjustable magnet position for use during calibration of the magnetic sensor, comprising:

a carrier having a cavity formed therein;

a plurality of electrical leads molded into said carrier;

a magnet, said cavity being shaped to receive said magnet therein, said magnet being shaped to slide into said cavity in response to an external force;

means associated with said cavity for guiding said magnet along a preselected axis as said magnet slides into said cavity in response to said external force;

means associated with said cavity for resisting the movement of said magnet as said magnet slides into said cavity in response to said external force, said resisting means being deformable in response to forcible contact with said magnet as said magnet slides into said cavity in response to said external force, said resisting means being shaped to retain said magnet in position within said cavity when said external force is not exerted against said magnet;

a magnetically sensitive component; and a substrate, said magnetically sensitive component being attached to said substrate, said substrate being attached to said carrier.

2. The sensor of claim 1, wherein:

said carrier is made of molded plastic.

3. The sensor of claim 1, wherein:

said magnet is a permanent magnet.

4. The sensor of claim 1, wherein:

said guiding means comprises a plurality of protrusions formed in walls of said cavity.

5. The sensor of claim 4, wherein:

said plurality of protrusions comprises a plurality of ribs, said plurality of ribs being aligned in parallel association with said preselected axis.

6. The sensor of claim 1, wherein:

said resisting means comprises a deformable rib.

7. The sensor of claim 1, wherein:

said magnetically sensitive component comprises a plurality of magnetoresistive elements.

8. The sensor of claim 7, wherein:

said plurality of magnetoresistive elements are connected together in an electrical bridge arrangement.

9. The sensor of claim 1, further comprising:

a plurality of electrical components attached to said substrate and connected in electrical communication with said magnetically sensitive component.

10. The sensor of claim 1, wherein:

said plurality of electrical leads extend through said carrier and are connected in electrical communication with said magnetically sensitive component.

11. The sensor of claim 1, wherein:

said carrier, said substrate, said magnet, and said magnetically sensitive component are encapsulated within an overmolded structure.

12. A magnetic sensor with adjustable magnet position for use during calibration of the magnetic sensor, comprising:

a carrier having a cavity formed therein, said carrier being made of molded plastic;

a plurality of electrical leads molded into said carrier;

a magnet, said cavity being shaped to receive said magnet therein, said magnet being shaped to slide into said cavity in response to an external force;

means associated with said cavity for guiding said magnet along a preselected axis as said magnet slides into said cavity in response to said external force;

means associated with said cavity for resisting the movement of said magnet as said magnet slides into said cavity in response to said external force, said resisting means being deformable in response to forcible contact with said magnet as said magnet slides into said cavity in response to said external force, said resisting means being shaped to retain said magnet in position within said cavity when said external force is not exerted against said magnet;

a magnetically sensitive component; and a substrate, said magnetically sensitive component being attached to said substrate, said substrate being attached to said carrier.

13. The sensor of claim 12, wherein:

said magnet is a permanent magnet.

14. The sensor of claim 12, wherein:

said guiding means comprises a plurality of protrusions formed in walls of said cavity.

15. The sensor of claim 14, wherein:

said plurality of protrusions comprises a plurality of ribs, said plurality of ribs being aligned in parallel association with said preselected axis.

16. The sensor of claim 12, wherein:

said resisting means comprises a deformable rib.

17. The sensor of claim 12, wherein:

said magnetically sensitive component comprises a plurality of magnetoresistive elements.

18. The sensor of claim 17, wherein:

said plurality of magnetoresistive elements are connected together in an electrical bridge arrangement.

19. The sensor of claim 12, further comprising:

a plurality of electrical components attached to said substrate and connected in electrical communication with said magnetically sensitive component, said plurality of electrical leads extend through said carrier and being connected in electrical communication with said magnetically sensitive component, said carrier, said substrate, said magnet, and said magnetically sensitive component being encapsulated within an overmolded structure.

20. A magnetic sensor with adjustable magnet position for use during calibration of the magnetic sensor, comprising:

a carrier having a cavity formed therein, said carrier being made of molded plastic;

a plurality of electrical leads molded into said carrier;

a magnet, said cavity being shaped to receive said magnet therein, said magnet being shaped to slide into said cavity in response to an external force;

means associated with said cavity for guiding said magnet along a preselected axis as said magnet slides into said cavity in response to said external force;

means associated with said cavity for resisting the movement of said magnet as said magnet slides into said cavity in response to said external force, said resisting means being deformable in response to forcible contact with said magnet as said magnet slides into said cavity in response to said external force, said resisting means being shaped to retain said magnet in position within said cavity when said external force is not exerted against said magnet;

a magnetically sensitive component;

a substrate, said magnetically sensitive component being attached to said substrate, said substrate being attached to said carrier, said magnet being a permanent magnet, said guiding means comprising a plurality of protrusions formed in walls of said cavity, said plurality of protrusions comprising a plurality of ribs, said plurality of ribs being aligned in parallel association with said preselected axis, said resisting means comprising a deformable rib, said magnetically sensitive component comprising a plurality of magnetoresistive elements, said plurality of magnetoresistive elements being connected together in an electrical bridge arrangement; and a plurality of electrical components attached to said substrate and connected in electrical communication with said magnetically sensitive component, said plurality of electrical leads extend through said carrier and being connected in electrical communication with said magnetically sensitive component, said carrier, said substrate, said magnet, and said magnetically sensitive component being encapsulated within an overmolded structure.

* * * * *